United States Patent
Ogura

(10) Patent No.: US 8,102,198 B2
(45) Date of Patent: Jan. 24, 2012

(54) RELAY CIRCUIT, INFORMATION PROCESSING APPARATUS, AND RELAY METHOD

(75) Inventor: Yoshinari Ogura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 81 days.

(21) Appl. No.: 12/578,738

(22) Filed: Oct. 14, 2009

(65) Prior Publication Data

US 2010/0026360 A1    Feb. 4, 2010

Related U.S. Application Data

(63) Continuation of application No. PCT/JP2007/058585, filed on Apr. 20, 2007.

(51) Int. Cl.
*H03L 5/00*    (2006.01)
(52) U.S. Cl. ..................... 327/306; 327/309
(58) Field of Classification Search ............. 326/62–63, 326/80–81; 327/306, 333, 309
See application file for complete search history.

(56) References Cited

U.S. PATENT DOCUMENTS

| 5,559,996 | A | * | 9/1996 | Fujioka | ............................ | 703/23 |
| 5,764,094 | A | * | 6/1998 | Hatsuda | ........................ | 327/333 |
| 2004/0041615 | A1 | | 3/2004 | Mukai | | |
| 2004/0155679 | A1 | | 8/2004 | Takiba et al. | | |
| 2005/0219924 | A1 | | 10/2005 | Takiba et al. | | |

FOREIGN PATENT DOCUMENTS

| JP | 6-19412 | 1/1994 |
| JP | 7-79151 | 3/1995 |
| JP | 2000-151383 | 5/2000 |
| JP | 2004-96563 | 3/2004 |
| JP | 2004-247846 | 9/2004 |
| JP | 2004-356779 | 12/2004 |

OTHER PUBLICATIONS

Form PCT/ISA/210, mailed Jul. 17, 2007, in corresponding International Application No. PCT/JP2007/058585 (3 pp.).
Form PCT/ISA/220, mailed Jul. 17, 2007, in corresponding International Application No. PCT/JP2007/058585 (4 pp.).
Form PCT/ISA/237, mailed Jul. 17, 2007, in corresponding International Application No. PCT/JP2007/058585 (3 PP.).
Written Opinion, mailed Jul. 17, 2007, in corresponding International Application No. PCT/JP2007/058585 (3 pp.).

* cited by examiner

*Primary Examiner* — Dinh T. Le
(74) *Attorney, Agent, or Firm* — Staas & Halsey LLP

(57) ABSTRACT

A relay circuit for relaying signal transmission between a first circuit driven by a first voltage and a second circuit driven by a second voltage different from the first voltage, the relay circuit includes: a waveform shaping circuit that obtains a shaped voltage by shaping a waveform of the second voltage in order to make a change of the second voltage steeper; and a buffer circuit that is driven by the first voltage and interrupts a signal transmission by the buffer circuit if the shaped voltage obtained by the waveform shaping circuit falls to or below a predetermined value, the shaped voltage being input to the buffer circuit as a control signal.

20 Claims, 15 Drawing Sheets

FIG. 5

| OPERATING STATE | S1 | S2 | S3 | S4 | S5 |
|---|---|---|---|---|---|
| COMPARATOR (−) TERMINAL INPUT VOLTAGE | Va | Vb | Vb | Vb | Va |
| COMPARATOR OUTPUT | L | H | UNDEFINED | H | L |
| Tr.A, Tr.B | OFF | ON | UNDEFINED | ON | OFF |
| Tr.N | OFF | ON | UNDEFINED | ON | OFF |
| Tr.P | ON | OFF | UNDEFINED | OFF | ON |

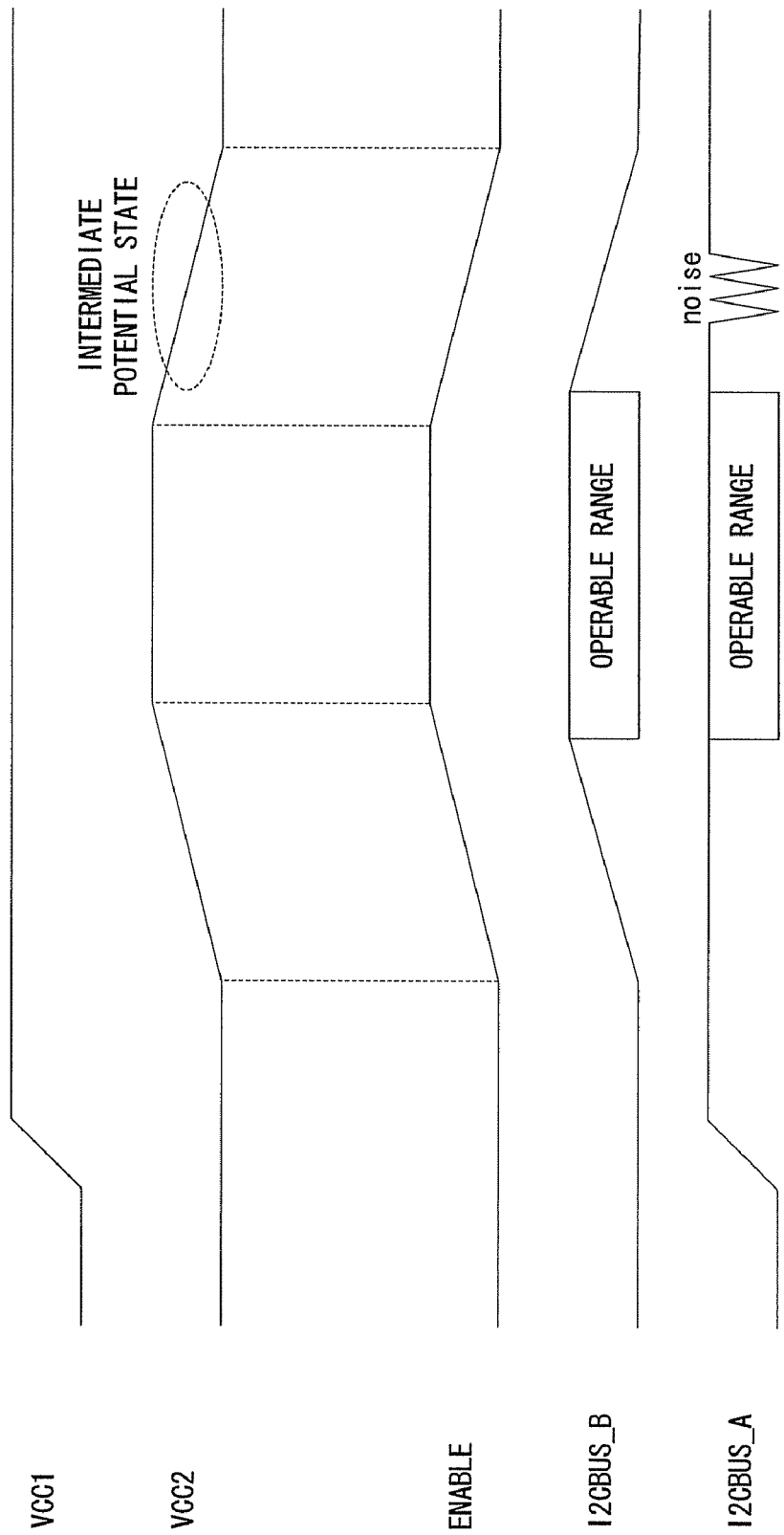

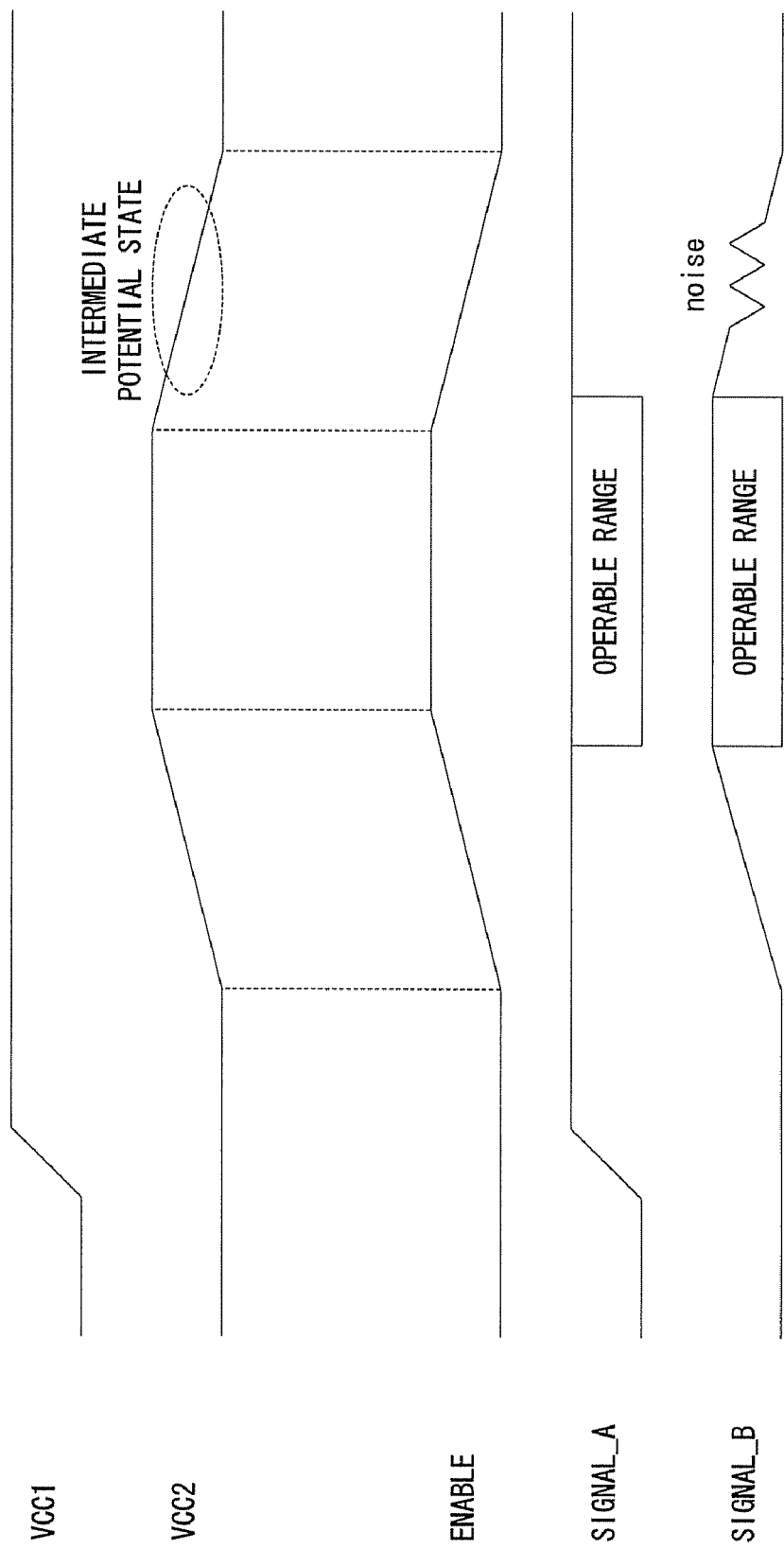

RELAY CIRCUIT, INFORMATION PROCESSING APPARATUS, AND RELAY METHOD

CROSS-REFERENCE TO RELATED APPLICATIONS

This application is a continuation application, filed under 35 U.S.C. §111(a), of PCT Application No. PCT/JP2007/058585, filed on Apr. 20, 2007, the disclosure of which is herein incorporated in its entirety by reference.

FIELD

The embodiments discussed herein are related to a relay circuit, an information processing apparatus, and a relay method that relay signal transmission between circuits.

BACKGROUND

When performing signal transmission between two devices that are driven by respective different power supplies, a bidirectional buffer (also referred to as "transceiver") is sometimes interposed between the devices in order to prevent breakdown of the devices. According to such a method, either one of the two power supplies can be connected to the enable terminal of the bidirectional buffer (also referred to as "transceiver") to protect the device of the system that is powered off.

FIG. 10 is a block diagram illustrating an example of the configuration of a conventional first information processing apparatus. The information processing apparatus includes a power supply 11 (first voltage generating circuit), a DC-DC converter 12 (second voltage generating circuit), a service processor 13 (first circuit), an ASIC (Application Specific Integrated Circuit) 14 (second circuit), and a bidirectional buffer 15 (buffer circuit).

The service processor 13 has I2CBUS_A which is composed of an I2C (I Square C) BUS, a two-wire bidirectional interface for external communication. Similarly, the ASIC 14 has I2CBUS_B which is composed of an I2C BUS for external communication.

FIG. 11 is a circuit diagram illustrating an example of the configuration of the bidirectional buffer. The bidirectional buffer 15 relays communication between the I2CBUS_A of the service processor 13 and the I2CBUS_B of the ASIC 14. The bidirectional buffer 15 is composed of tri-state buffers 21a and 21b. The tri-state buffers 21a and 21b are powered by VCC1. VCC2 is input to the enable terminal of each of the tri-state buffers 21a and 21b.

When VCC2 input to the enable terminal exceeds a predetermined threshold and becomes H (High), the signal input from the I2CBUS_A is output to the I2CBUS_B and the signal input from the I2CBUS_B is output to the I2CBUS_A. When VCC2 input to the enable terminal falls below a predetermined threshold and becomes L (Low), the I2CBUS_A and the I2CBUS_B are cut off. It should be appreciated that the enable terminal of the tri-state buffer 21b may be supplied with inverted VCC2.

FIG. 12 is a timing chart illustrating the operation of the conventional first information processing apparatus. The timing chart depicts, from the top, the waveforms of AC power, a primary DC voltage, VCC1, a power-on instruction, and VCC2. Initially, when the AC power is input to the power supply 11 and a power breaker is turned on, the power supply 11 supplies the resident power source VCC1 to the service processor 13 and supplies the primary DC voltage to the DC-DC converter 12.

Next, the service processor 13 which is activated by VCC1 sends a power-on instruction to the DC-DC converter 12. Receiving the power-on instruction, the DC-DC converter 12 supplies VCC2 to the ASIC 14 and supplies VCC2 to the enable terminal (ENABLE) of the bidirectional buffer 15. Here, VCC2 rises and falls gentler than the changes of the signals.

Next, description will be given of the case where unidirectional communication is made from one device to another.

FIG. 13 is a block diagram illustrating an example of the configuration of a conventional second information processing apparatus. In the diagram, the same reference symbols as in FIG. 10 will designate components identical or equivalent to those illustrated in FIG. 1, and description thereof will be omitted. The diagram, as compared to FIG. 1, includes a transmitting unit 23 (first circuit) instead of the service processor 13, a receiving unit 24 (second circuit) instead of the ASIC 14, and a unidirectional buffer 25 (buffer circuit: also referred to as "driver") instead of the bidirectional buffer 15. The transmitting unit 23 has a terminal of a signal SIGNAL_A to be transmitted outside. The receiving unit 24 has a terminal of a signal SIGNAL_B to be received from outside.

FIG. 14 is a block diagram illustrating an example of the configuration of the unidirectional buffer. The unidirectional buffer 25 relays between SIGNAL_A and SIGNAL_B. The unidirectional buffer 25 is composed of a tri-state buffer 21c which is controlled through the enable terminal. The tri-state buffer 21c is powered by VCC1. VCC2 is supplied to the enable terminal of the tri-state buffer 21c.

The operation of the second information processing apparatus is the same as in FIG. 12. Initially, when the AC power is input to the power supply 11 and the power breaker is turned on, the power supply 11 supplies the resident power source VCC1 to the transmitting unit 23 and supplies the primary DC voltage to the DC-DC converter 12.

Next, the transmission unit 23 which is activated by VCC1 sends a power-on instruction to the DC-DC converter 12. Receiving the power-on instruction, the DC-DC converter 12 supplies VCC2 to the receiving unit 24 and inputs VCC2 to the enable terminal (ENABLE) of the unidirectional buffer 25.

When VCC2 input to the enable terminal exceeds a predetermined threshold and becomes H, the signal input from SIGNAL_A is output to SIGNAL_B. When VCC2 input to the enable terminal falls below a predetermined threshold and becomes L, the signal input from SIGNAL_A is not output to SIGNAL_B but interrupted.

Among conventional technologies pertaining to the present invention is an output buffer circuit that prevents the occurrence of a leak current and can output a voltage up to an applied voltage quickly when a voltage higher than its own power supply voltage is applied to a common bus.

Patent Document 1: Japanese Laid-Open Patent Publication No. 2000-151383

Now, when the power supply connected to the enable terminal of the bidirectional buffer is turned off, the voltage of the power supply falls slowly due to load capacitances, so that the intermediate potential state can sometimes last long. In such cases, noise occurs at the input and output ends of the bidirectional buffer, sometimes causing system malfunction.

FIG. 15 is a timing chart illustrating an example of the operation of the conventional bidirectional buffer. The timing chart illustrates the operation of the bidirectional buffer in the operation of the first information processing apparatus illustrated in FIG. 12, depicting the waveforms of VCC1, VCC2, ENABLE, I2CBUS_B, and I2CBUS_A from the top. The connection described above makes VCC2 and ENABLE equal to each other. VCC1 from the power supply 11 rises initially, and then ENABLE rises along with the rise of VCC2 from the DC-DC converter 12.

When VCC2 and ENABLE reach a prescribed voltage, I2CBUS_A and I2CBUS_B become operable. Next, when the DC-DC converter 12 is powered off, ENABLE gradually falls with VCC2. Since the intermediate potential state of VCC2 and ENABLE lasts long, noise occurs in I2CBUS_A in the intermediate potential state.

Similarly, when the power supply connected to the enable terminal of the unidirectional buffer is turned off, the voltage of the power supply falls slowly due to load capacitances, so that the intermediate potential state can sometimes last long. In such cases, noise occurs at the output end of the unidirectional buffer, sometimes causing system malfunction.

FIG. 16 is a timing chart illustrating an example of the operation of the conventional unidirectional buffer. The timing chart illustrates the operation of the unidirectional buffer for the same operation of the second information processing apparatus as that of the first information processing apparatus illustrated in FIG. 12, depicting the waveforms of VCC1, VCC2, ENABLE, SIGNAL_A, and SIGNAL_B from the top. VCC1 from the power supply 11 rises initially, and then ENABLE rises along with the rise of VCC2 from the DC-DC converter 12.

When VCC2 and ENABLE reach a prescribed voltage, SIGNAL_A and SIGNAL_B become operable. Next, when the DC-DC converter 12 is powered off, ENABLE gradually falls with VCC2. Since the intermediate potential state of VCC2 and ENABLE lasts long, noise occurs in SIGNAL_B in the intermediate potential state.

The present invention has been achieved in order to solve the foregoing problems, and it is an object of the present invention to provide a relay circuit, an information processing apparatus, and a relay method that prevents the occurrence of noise that results when the enable terminal of a buffer for relaying between circuits enters an intermediate potential state.

SUMMARY

According to an aspect of the invention, a relay circuit for relaying signal transmission between a first circuit driven by a first voltage and a second circuit driven by a second voltage different from the first voltage, the relay circuit includes: a waveform shaping circuit that obtains a shaped voltage by shaping a waveform of the second voltage in order to make a change of the second voltage steeper; and a buffer circuit that is driven by the first voltage and interrupts a signal transmission by the buffer circuit if the shaped voltage obtained by the waveform shaping circuit falls to or below a predetermined value, the shaped voltage being input to the buffer circuit as a control signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 5 is a table illustrating an example of the operation of the reset circuit according to embodiment 1;

FIG. 15 is a timing chart illustrating an example of the operation of a conventional bidirectional buffer; and FIG. 16 is a timing chart illustrating an example of the operation of a conventional unidirectional buffer.

DESCRIPTION OF EMBODIMENTS

Hereinafter, examples of embodiment of the present invention will be described with reference to the drawings.

Embodiment 1

The present embodiment will deal with a relay circuit and an information processing apparatus that use a bidirectional buffer.

Initially, description will be given of the configuration of the information processing apparatus according to the present embodiment.

Figure 1:
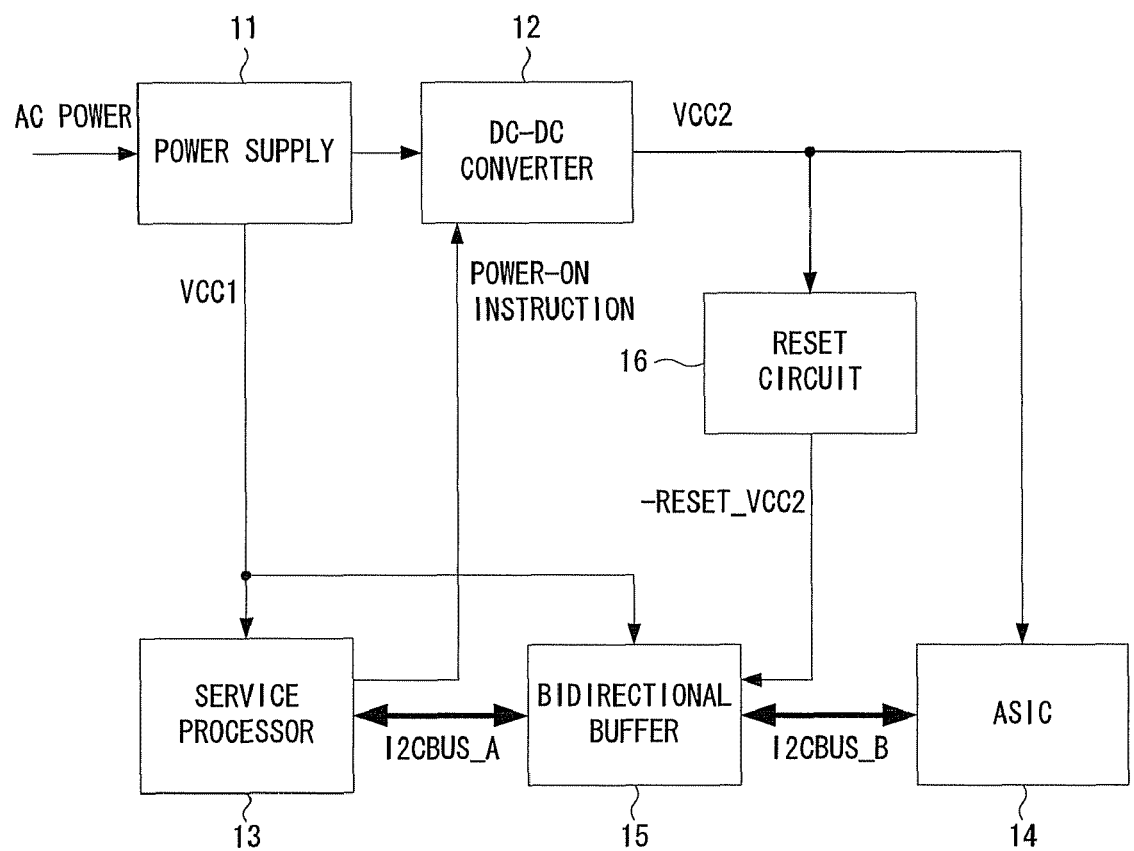
FIG. 1 is a block diagram illustrating an example of the configuration of an information processing apparatus according to embodiment 1.
Figure 10:
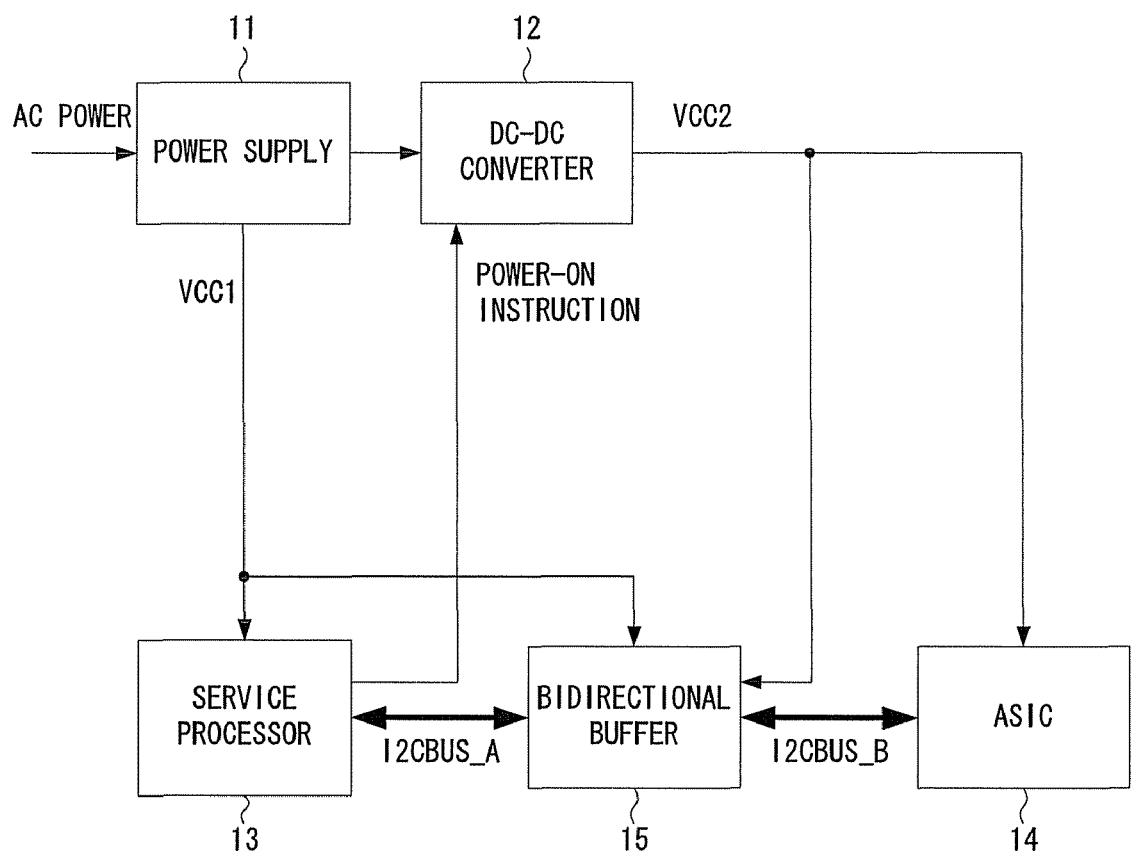
FIG. 10 is a block diagram illustrating an example of the configuration of a conventional first information processing apparatus.
Figure 11:
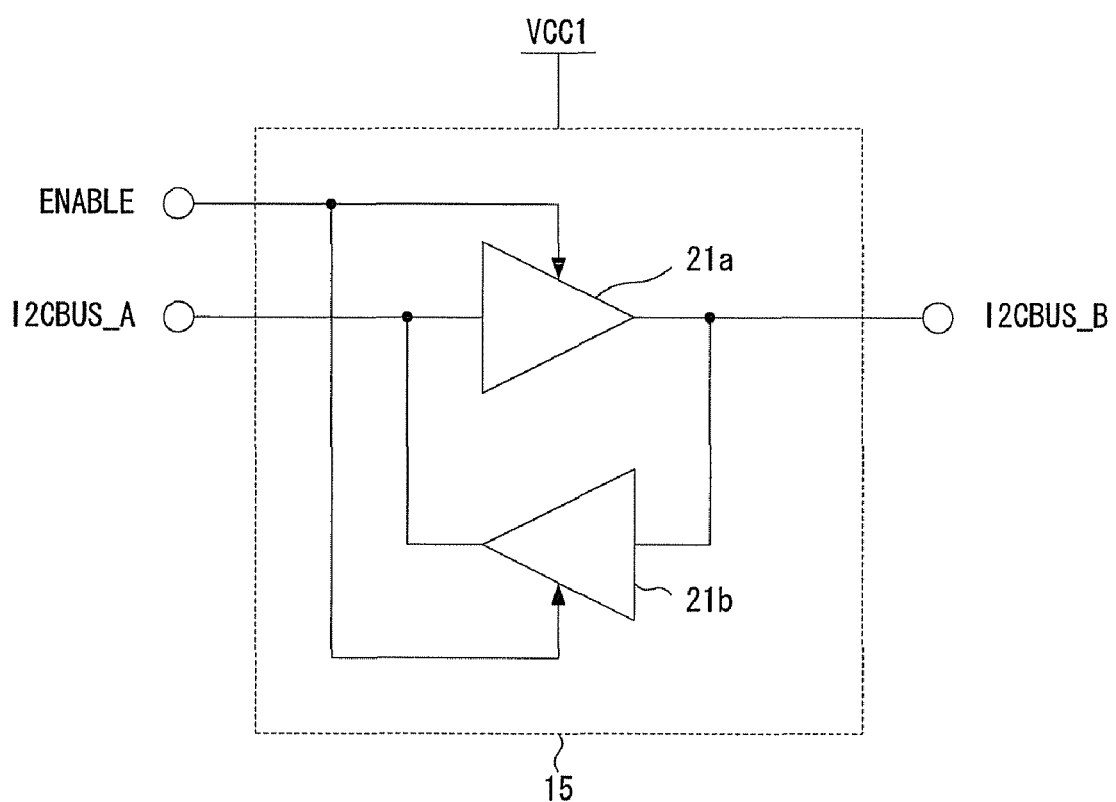
FIG. 11 is a circuit diagram illustrating an example of the configuration of a bidirectional buffer.

FIG. 1 is a block diagram illustrating an example of the configuration of the information processing apparatus according to the present embodiment. In the diagram, the same reference symbols as in FIG. 10 will designate components identical or equivalent to those illustrated in FIG. 10, and description thereof will be omitted. The diagram, as compared to FIG. 10, newly includes a reset circuit 16 (waveform shaping circuit). The reset circuit 16 generates -RESET_VCC2 from VCC2 which is supplied from a DC-DC converter 12, and outputs -RESET_VCC2 to the enable terminal (ENABLE) of a bidirectional buffer 15 (obtaining). -RESET_VCC2 is a signal that changes steeply with VCC2. Note that -RESET_VCC2 can be used in other devices in the information processing apparatus as a power-on reset signal, a reset signal that is linked with power-on. The reset circuit 16 thus yields no increase in the cost of the information processing apparatus. It should be appreciated that the relay circuit corresponds to the reset circuit 16 and the bidirectional buffer 15 according to the present embodiment.

Next, the operation of the information processing apparatus according to the present embodiment will be described.

Figure 2:
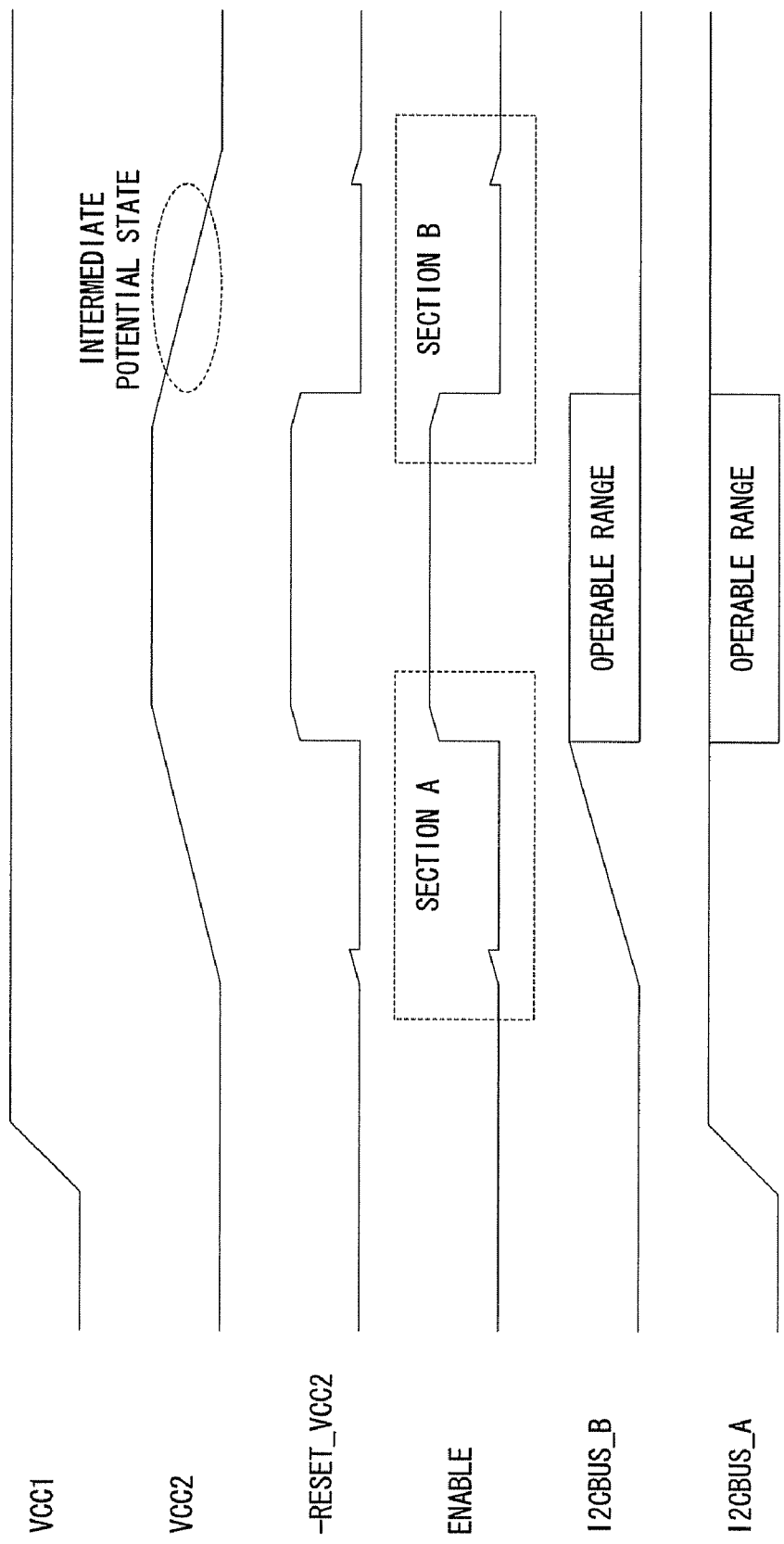
FIG. 2 is a timing chart illustrating an example of the operation of a bidirectional buffer according to embodiment 1.
Figure 12:
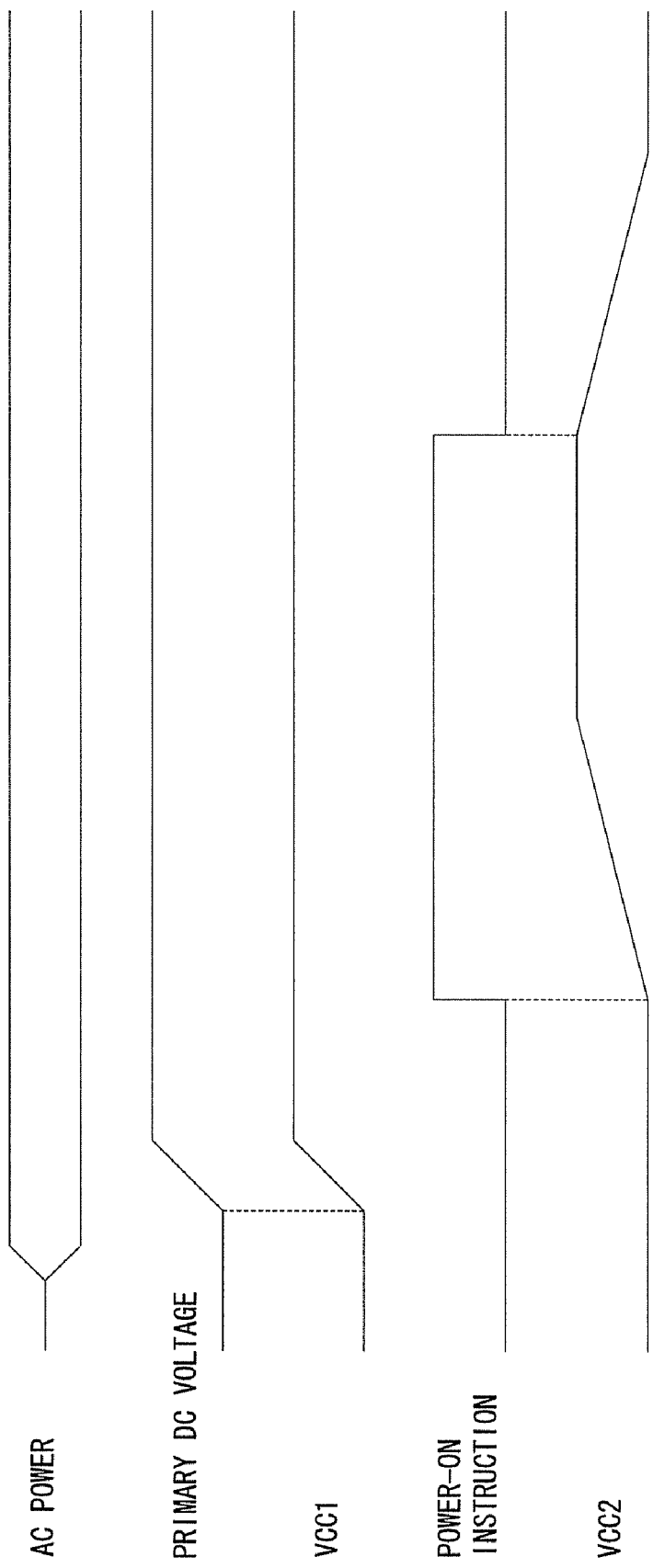
FIG. 12 is a timing chart illustrating the operation of the conventional first information processing apparatus.

The operation of the AC power, the primary DC voltage, VCC1, the power-on instruction, and VCC2 is the same as in FIG. 12. FIG. 2 is a timing chart illustrating an example of the operation of the bidirectional buffer according to the present embodiment. The timing chart illustrates the operation of the bidirectional buffer for the same operation of the information processing apparatus as in FIG. 12, depicting the waveforms of VCC1, VCC2, -RESET_VCC2, ENABLE, I2CBUS_B, and I2CBUS_A from the top. The operation of VCC1 and VCC2 is the same as in FIG. 12. The connection described above makes -RESET_VCC2 and ENABLE equal to each other.

The ENABLE waveform of the chart differs from that of FIG. 15 in section A where VCC2 rises and section B where VCC2 falls. The section A of the ENABLE waveform is steeper than the rise of VCC2. Similarly, the section B of the ENABLE waveform is steeper than the fall of VCC2. Consequently, there occurs no intermediate potential state in the section B of the ENABLE waveform. With VCC2 in the intermediate potential state, ENABLE becomes L and the bidirectional buffer 15 interrupts the signal transmission between I2CBUS_A and I2CBUS_B (interrupting), which can prevent the conventional production of noise in I2CBUS_A. Here, the section A and section B of the ENABLE waveform are ascribable to the operation of the reset circuit 16.

Next, the reset circuit 16 will be described in detail.

Figure 3:
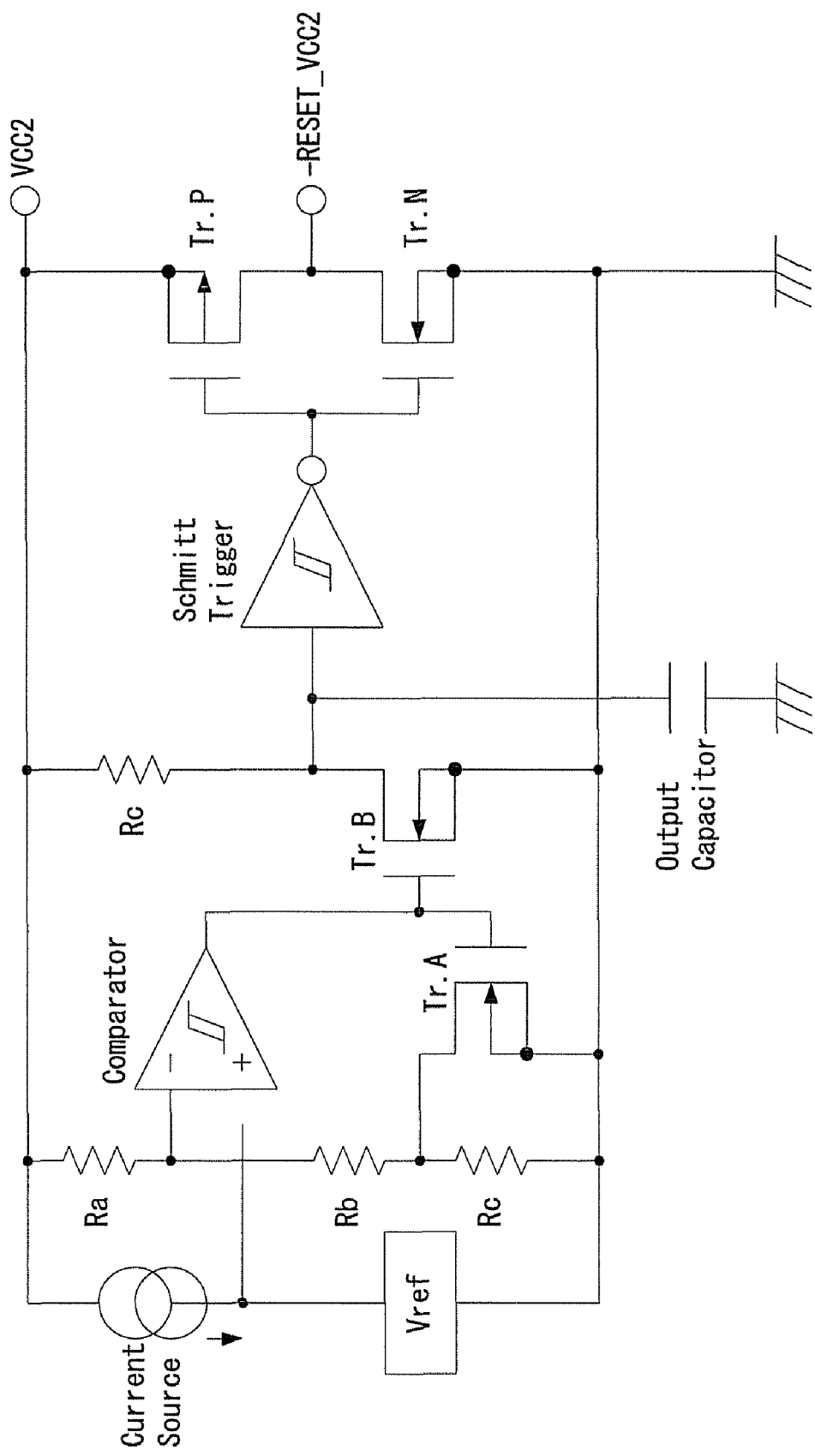
FIG. 3 is a block diagram illustrating an example of the configuration of a reset circuit according to embodiment 1.

FIG. 3 is a block diagram illustrating an example of the configuration of the reset circuit according to the present embodiment. The reset circuit 16 includes a current source, a voltage source Vref, a comparator, a Schmitt trigger, a transistor A (Tr.A), a transistor B (Tr.B), an output transistor Pch (Tr.P), an output transistor Nch (Tr.N), an output capacitor, and resistors Ra, Rb, and Rc.

Figure 4:
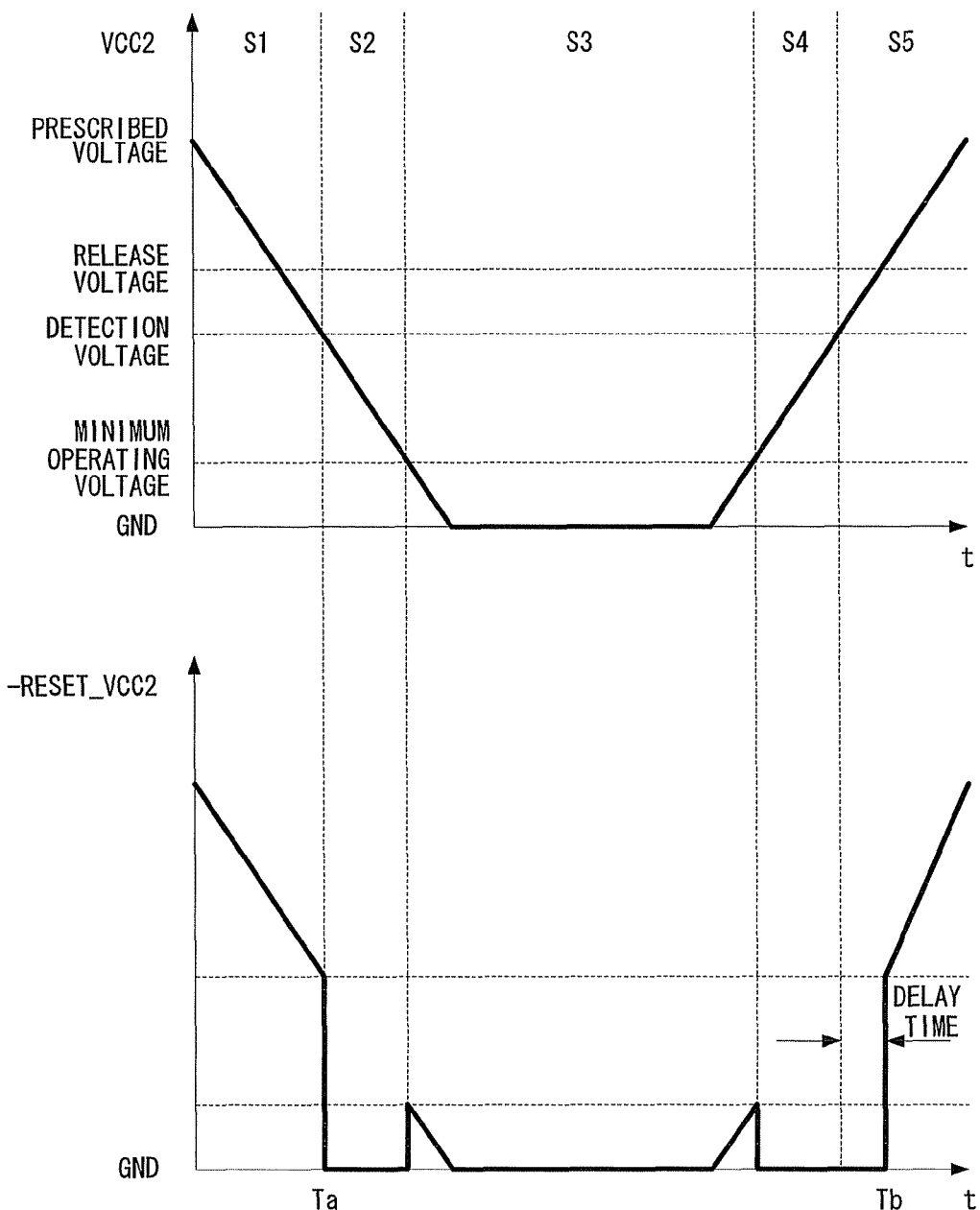
FIG. 4 is a timing chart illustrating an example of the operation of the reset circuit according to embodiment 1.

FIG. 4 is a timing chart illustrating an example of the operation of the reset circuit according to the present embodiment. The upper section illustrates the waveform of VCC2 which is the input voltage to the reset circuit 16, and illustrates the waveform of -RESET_VCC2 which is the output voltage from the reset circuit 16. A release voltage is higher than a detection voltage, and the difference between the release voltage and the detection voltage is a hysteresis width. The minimum operating voltage is a minimum voltage at which each transistor operates.

The operating states S1, S2, S3, S4, and S5 are defined according to the changes of VCC2. Suppose that VCC2 decreases from a prescribed value to GND (ground voltage) and then increases from GND to the prescribed value. Initially, the state where VCC2 decreases from the prescribed voltage to the detection voltage will be S1. Next, the state where VCC2 decreases from the detection voltage to the minimum operating voltage will be S2. The state where VCC2 decreases from the minimum operating voltage to GND and increases from GND to the minimum operating voltage will be S3. Next, the state where VCC2 increases from the minimum operating voltage to the detection voltage will be S4. Next, the state where VCC2 increases from the detection voltage to the prescribed voltage will be S5. The time at which decreasing VCC2 reaches the detection voltage will be Ta and the time at which increasing VCC2 reaches the release voltage will be Tb. Because of the hysteresis mentioned above, there is a delay time between the transition from the state S4 to the state S5 and the time Tb.

FIG. 5 is a table illustrating an example of the operating states of the reset circuit according to the present embodiment. The comparator (-) terminal input voltage, the comparator output, the states of Tr.A and Tr.B, the state of Tr.N, and the state of Tr.P are illustrated for each of the operating states S1, S2, S3, S4, and S5. Va of the comparator (-) terminal input voltage is expressed by the following equation:

$$Va = \frac{Rb + Rc}{Ra + Rb + Rc} \times VCC2 \qquad \text{[MATH 1]}$$

Similarly, Vb of the comparator (-) terminal input voltage is expressed by the following equation:

$$Vb = \frac{Rb}{Ra + Rb} \times VCC2 \qquad \text{[MATH 2]}$$

In the state S1, -RESET_VCC2 becomes equal to VCC2. In the state S2, VCC2 decreases to the detection voltage (Ta) so that Vref≧Va. The comparator output is inverted from L to H, and -RESET_VCC2 is at GND. In the state 3 where VCC2 is lower than the minimum operating voltage, the states of Tr.N and Tr.P are undefined. In the state 4, -RESET_VCC2 is at GND. In the state 5, VCC2 increases to the release voltage (Tb) so that Vref≦Vb. The comparator output reaches a threshold voltage for H, the Schmitt trigger output is inverted from H to L, and -RESET_VCC2 becomes equal to VCC2.

Figure 6:
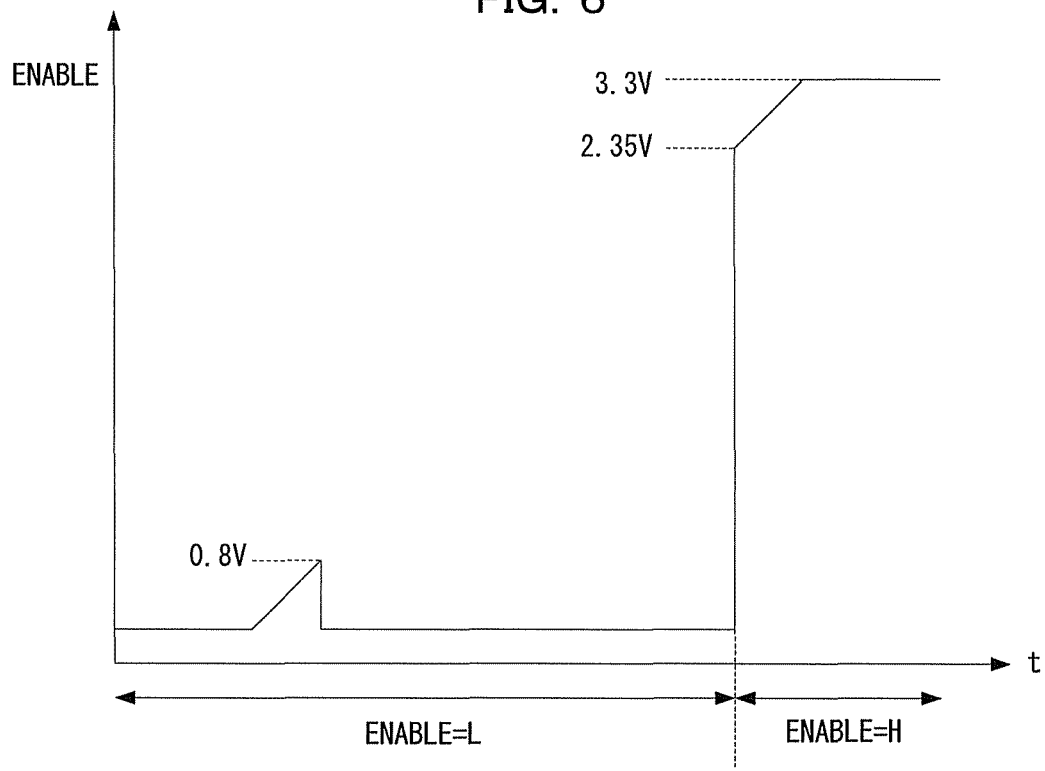
FIG. 6 is a timing chart illustrating an example of section A of an ENABLE waveform according to embodiment 1.

FIG. 6 is a timing chart illustrating an example of the section A of the ENABLE waveform according to the present embodiment. The section A corresponds to the states S3, S4, and S5. Here, ENABLE is in the L state. -RESET_VCC2 is equal to VCC2 until the power-on instruction becomes H and VCC2 increases from GND to the minimum operating voltage (for example, 0.8 V or so) (state S3). Next, -RESET_VCC2 becomes equal to GND until VCC2 further increases to reach the release voltage (for example, 2.35 V or so) (state S4). Next, when VCC2 increases further, -RESET_VCC2 becomes equals to VCC2 and ENABLE enters the H state. Subsequently, VCC2 and -RESET_VCC2 reach the prescribed voltage (for example, 3.3 V) (state S5).

Figure 7:
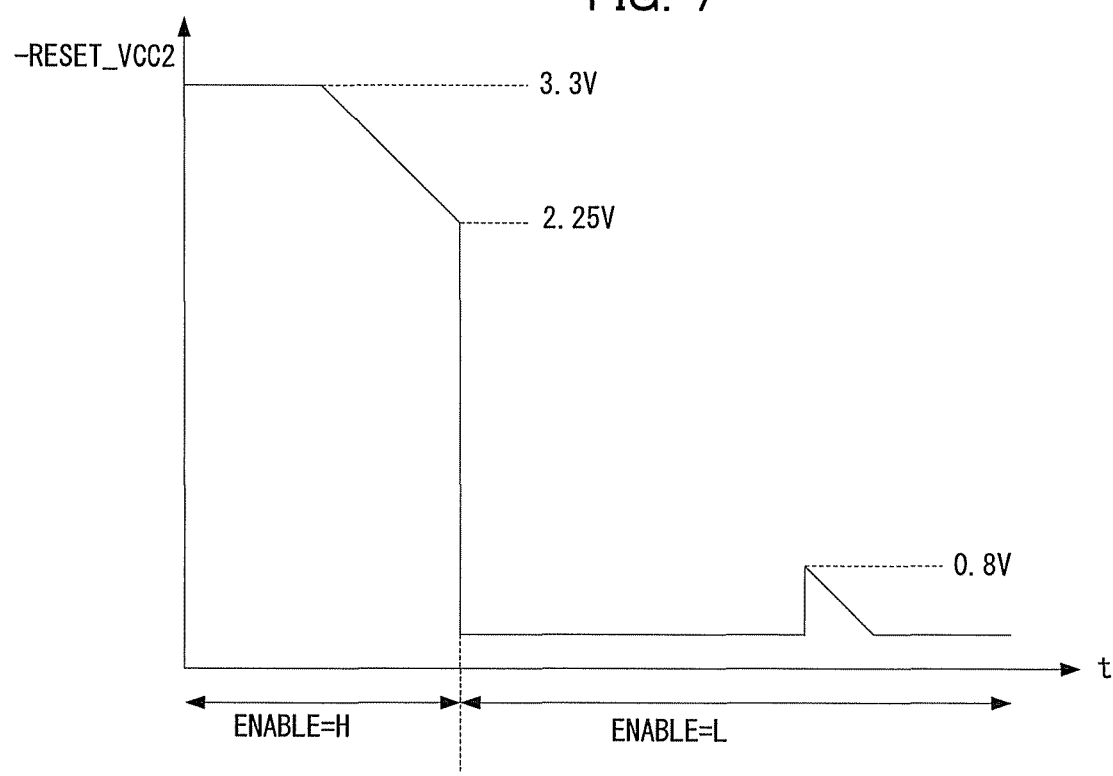
FIG. 7 is a timing chart illustrating an example of section B of the ENABLE waveform according to embodiment 1.

FIG. 7 is a timing chart illustrating an example of the section B of the ENABLE waveform according to the present embodiment. The section B corresponds to the states S1, S2, and S3. Here, ENABLE is in the H state. -RESET_VCC2 is equal to VCC2 until the power-on instruction becomes L and VCC2 decreases from the prescribed voltage to the detection voltage (for example, 2.25 V or so) (state S1). Next, -RESET_VCC2 becomes equal to GND and ENABLE enters the L state until VCC2 further decreases to the minimum operating voltage (state S2). Next, VCC2 decreases further, and -RESET_VCC2 becomes equal to VCC2. VCC2 and -RESET_VCC2 subsequently come to GND (state S3).

The foregoing operation of the reset circuit 16 can make the section A of the ENABLE waveform steeper than the rise of VCC2, and make the section B of the ENABLE waveform steeper than the fall of VCC2. Consequently, ENABLE can be set to L during the period where VCC2 is in the intermediate potential state.

Embodiment 2

The present embodiment will deal with a relay circuit and an information processing apparatus that use a unidirectional buffer.

Initially, description will be given of the configuration of the information processing apparatus according to the present embodiment.

Figure 8:
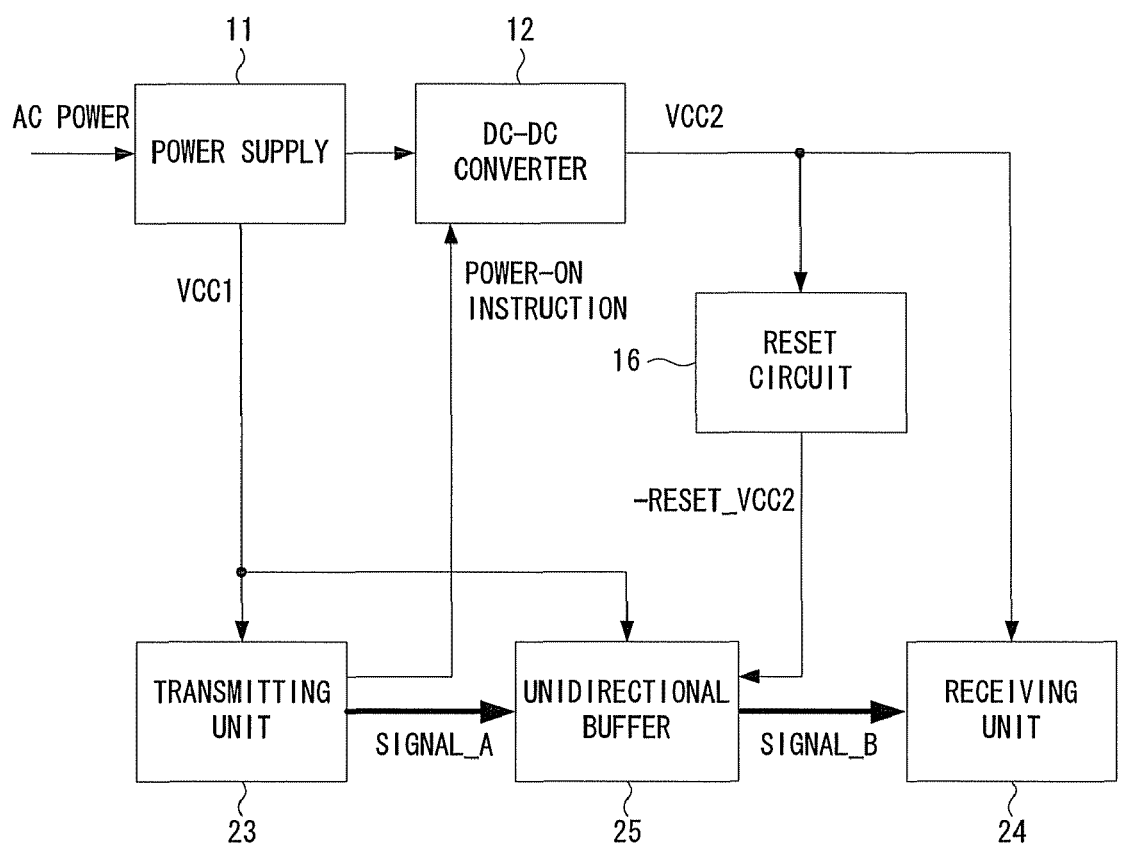
FIG. 8 is a block diagram illustrating an example of the configuration of an information processing apparatus according to embodiment 2.
Figure 13:
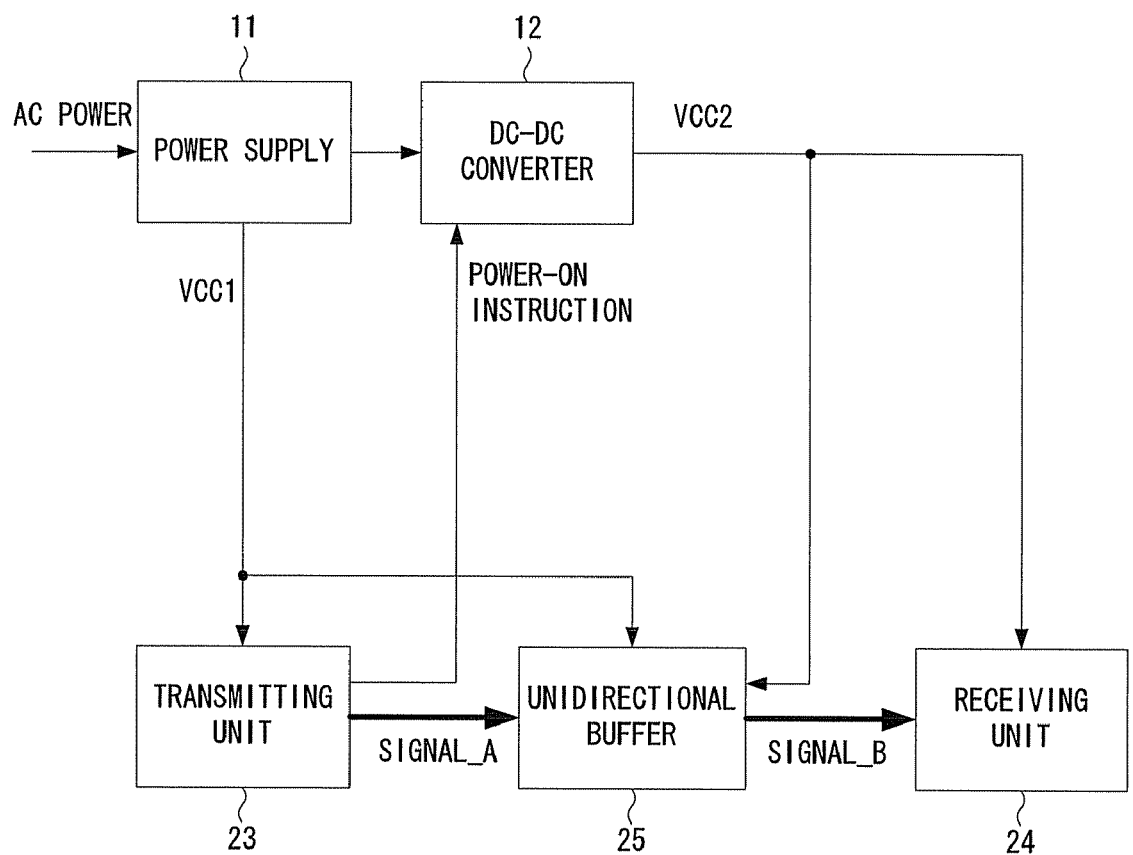
FIG. 13 is a block diagram illustrating an example of the configuration of a conventional second information processing apparatus.
Figure 14:
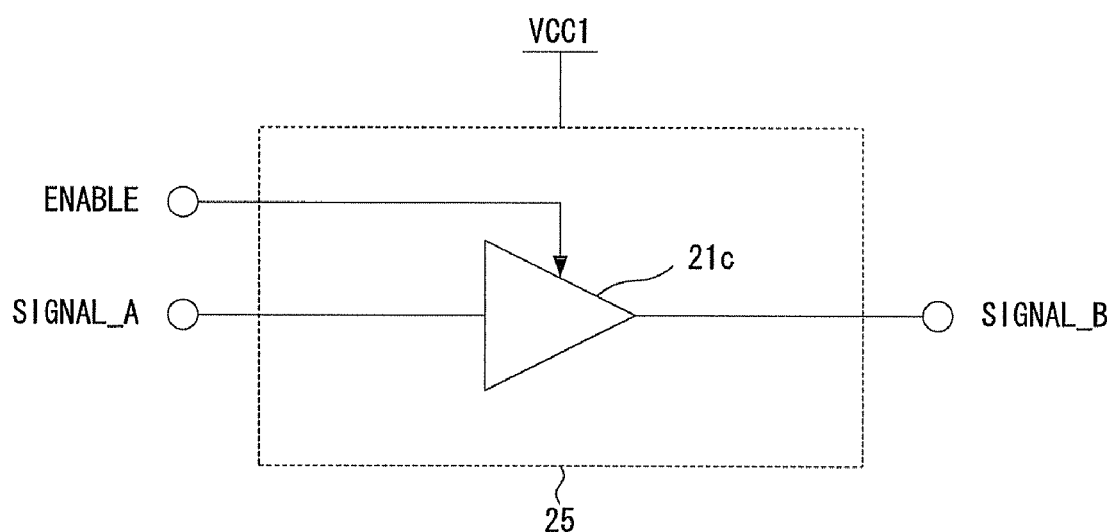
FIG. 14 is a block diagram illustrating an example of the configuration of a unidirectional buffer.

FIG. 8 is a block diagram illustrating an example of the configuration of the information processing apparatus according to the present embodiment. In the diagram, the same reference symbols as in FIG. 13 will designate components identical or equivalent to those illustrated in FIG. 13, and description thereof will be omitted. As compared to FIG. 13, the diagram newly includes a reset circuit 16. As in embodiment 1, the reset circuit 16 generates -RESET_VCC2 from VCC2 which is supplied from the DC-DC converter 12, and outputs -RESET_VCC2 to the enable terminal (ENABLE) of the unidirectional buffer 25. It should be appreciated that the relay circuit corresponds to the reset circuit 16 and the unidirectional buffer 25 according to the present embodiment.

Next, the operation of the information processing apparatus according to the present embodiment will be described.

Figure 9:
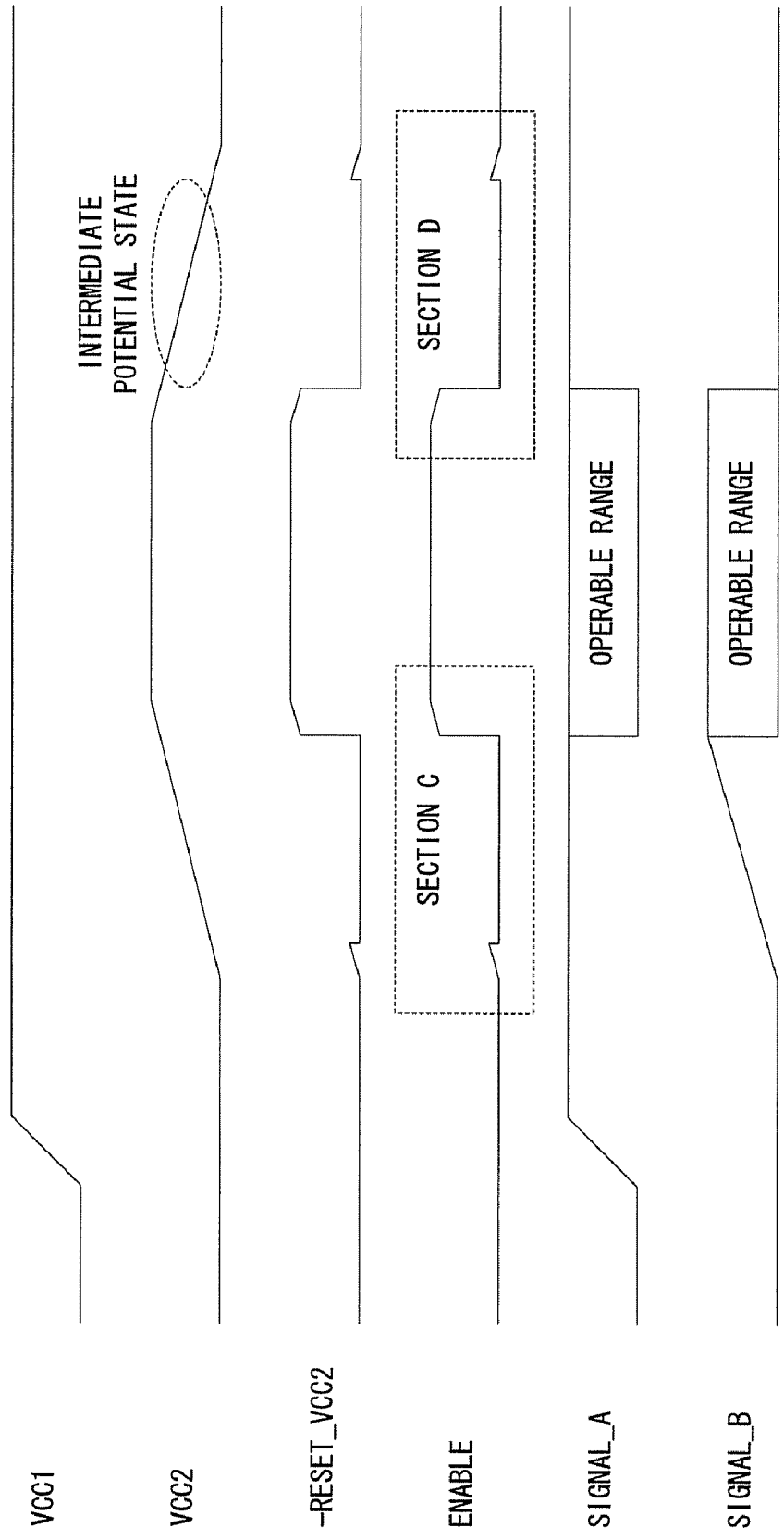
FIG. 9 is a timing chart illustrating an example of the operation of a unidirectional buffer according to embodiment 2.

The operation of the AC power, the primary DC voltage, VCC1, the power-on instruction, and VCC2 is the same as in FIG. 12. FIG. 9 is a timing chart illustrating an example of the operation of the unidirectional buffer according to the present embodiment. The timing chart illustrates the operation of the unidirectional buffer 25 for the same operation of the information processing apparatus as in FIG. 12, depicting the waveforms of VCC1, VCC2, -RESET_VCC2, ENABLE, and SIGNAL_B from the top. The operation of VCC1 and VCC2 is the same as in FIG. 12.

The ENABLE waveform of the chart differs from that of FIG. 16 in section C where VCC2 rises and section D where VCC2 falls. The section C of the ENABLE waveform is steeper than the rise of VCC2. Similarly, the section D of the ENABLE waveform is steeper than the fall of VCC2. Consequently, there occurs no intermediate potential state in the section D of the ENABLE waveform. With VCC2 in the intermediate potential state, ENABLE becomes L and the unidirectional buffer 25 interrupts the signal transmission from SIGNAL_A to SIGNAL_B (interrupting), which can prevent the conventional production of noise in SIGNAL_B. As in embodiment 1, the section C and section D of the ENABLE waveform are ascribable to the operation of the reset circuit 16.

Examples of the information processing apparatus according to the present embodiment may include a PC (Personal Computer) and a server.

According to the present invention, it is possible to prevent the production of noise that results when the enable terminal of the buffer for relaying between circuits enters an intermediate potential state.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a depicting of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A relay circuit for relaying signal transmission between a first circuit driven by a first voltage and a second circuit driven by a second voltage different from the first voltage, the relay circuit comprising:

a waveform shaping circuit that, when a value of the second voltage decreases to a predetermined first voltage value, outputs a control signal having a voltage value which is lower than the predetermined first voltage value; and a buffer circuit that includes at least one tri-state buffer, is driven by the first voltage, receives the control signal from the waveform shaping circuit, and interrupts the signal transmission by the buffer circuit when the voltage of the control signal falls to or below a predetermined second voltage value.

2. The relay circuit according to claim 1, wherein the waveform shaping circuit outputs the control signal at at least either one of a rise and a fall of the second voltage.

3. The relay circuit according to claim 1, wherein the waveform shaping circuit makes a voltage level of the control signal equal to a level of a ground voltage when the value of the second voltage decreases to the predetermined first voltage value.

4. The relay circuit according to claim 3, wherein the waveform shaping circuit makes the voltage level of the control signal equal to a level of the second voltage when the value of the second voltage does not decrease to the predetermined first voltage value.

5. The relay circuit according to claim 3, wherein when the value of the second voltage is lower than the predetermined first voltage value and is higher than a predetermined minimum operating voltage value which is lower than the predetermined first voltage value, the waveform shaping circuit outputs the control signal.

6. The relay circuit according to claim 1, wherein the control signal is utilized as a reset signal for a circuit which is supplied with the second voltage within an information processing apparatus.

7. The relay circuit according to claim 1, wherein the buffer circuit is a unidirectional buffer; the control signal is supplied to an enable terminal of the tri-state buffer; an output terminal of the first circuit is connected to an input terminal of the tri-state buffer; and an input terminal of the second circuit is connected to an output terminal of the tri-state buffer.

8. The relay circuit according to claim 1, wherein the buffer circuit is a bidirectional buffer that includes at least a first tri-state buffer and a second tri-state buffer; the control signal is input to enable terminals of the first tri-state buffer and the second tri-state buffer; an input/output terminal of the first circuit is connected to an input terminal of the first tri-state buffer and an output terminal of the second tri-state buffer; and an input/output terminal of the second circuit is connected to an output terminal of the first tri-state buffer and an input terminal of the second tri-state buffer.

9. An information processing apparatus comprising:

a first voltage generating circuit that generates a first voltage;

a second voltage generating circuit that generates a second voltage different from the first voltage;

a first circuit that is driven by the first voltage;

a second circuit that is driven by the second voltage;

a waveform shaping circuit that, when a value of the second voltage decreases to a predetermined first voltage value, outputs a control signal having a voltage value which is lower than the predetermined first voltage value; and a buffer circuit that includes at least one tri-state buffer, is arranged between the first circuit and the second circuit, is driven by the first voltage and interrupts the signal transmission by the buffer circuit when the voltage of the control signal falls to or below a predetermined second voltage value.

10. The information processing apparatus according to claim 9, wherein
the waveform shaping circuit outputs the control signal at at least either one of a rise and a fall of the second voltage.

11. The information processing apparatus according to claim 9, wherein
the waveform shaping circuit makes a voltage level of the control signal equal to a level of a ground voltage when the value of the second voltage decreases to the predetermined first voltage value.

12. The information processing apparatus according to claim 11, wherein
the waveform shaping circuit makes the voltage level of the control signal equal to a level of the second voltage when the value of the second voltage does not decrease to the predetermined first voltage value.

13. The information processing apparatus according to claim 11, wherein
when the value of the second voltage is lower than the predetermined first voltage value and is higher than a predetermined minimum operating voltage value which is lower than the predetermined first voltage value, the waveform shaping circuit outputs the control signal.

14. The information processing apparatus according to claim 9, wherein
the control signal is utilized as a reset signal for a circuit which is supplied with the second voltage within the information processing apparatus.

15. The information processing apparatus according to claim 9, wherein:
the buffer circuit is a unidirectional buffer that the control signal is supplied to an enable terminal of the tri-state buffer; an output terminal of the first circuit is connected to an input terminal of the tri-state buffer; and an input terminal of the second circuit is connected to an output terminal of the tri-state buffer.

16. The information processing apparatus according to claim 9, wherein:
the buffer circuit is a bidirectional buffer that includes at least a first tri-state buffer and a second tri-state buffer; the control signal is input to enable terminals of the first tri-state buffer and the second tri-state buffer; an input/output terminal of the first circuit is connected to an input terminal of the first tri-state buffer and an output terminal of the second tri-state buffer; and an input/output terminal of the second circuit is connected to an output terminal of the first tri-state buffer and an input terminal of the second tri-state buffer.

17. The information processing apparatus according to claim 9, wherein:
the first voltage generating circuit, after being activated, instructs the second voltage generating circuit to generate the second voltage; and
the second voltage generating circuit generates the second voltage based on the instruction from the first voltage generating circuit.

18. A relay method for relaying signal transmission between a first circuit that is driven by a first voltage and a second circuit that is driven by a second voltage different from the first voltage, the method comprising:
outputting a control signal having a voltage value which is lower than a predetermined first voltage when a value of the second voltage decreases to the predetermined first voltage value; and
interrupting the signal transmission by a buffer circuit when the voltage of the control signal falls to or below a predetermined second voltage value, the buffer circuit being arranged between the first circuit and the second circuit, the buffer circuit being driven by the first voltage, the control signal being input to the buffer circuit.

19. The relay method according to claim 18, wherein
the control signal is output at least either one of a rise and a fall of the second voltage.

20. The relay method according to claim 18, wherein
the outputting makes a voltage level of the control signal equal to a level of a ground voltage when the value of the second voltage decreases to the predetermined first voltage value.

* * * * *

UNITED STATES PATENT AND TRADEMARK OFFICE
CERTIFICATE OF CORRECTION

PATENT NO. : 8,102,198 B2
APPLICATION NO. : 12/578738
DATED : January 24, 2012
INVENTOR(S) : Yoshinari Ogura It is certified that error appears in the above-identified patent and that said Letters Patent is hereby corrected as shown below:

Column 10, Line 34, In Claim 19, delete "at least" and insert -- at at least --, therefor.

Signed and Sealed this
Tenth Day of April, 2012

David J. Kappos
*Director of the United States Patent and Trademark Office*